United States Patent [19]
Waterworth

[11] Patent Number: 4,701,745
[45] Date of Patent: Oct. 20, 1987

[54] DATA COMPRESSION SYSTEM

[75] Inventor: John R. Waterworth, Cheadle, England

[73] Assignee: Ferranti, plc, Cheshire, England

[21] Appl. No.: 835,793

[22] Filed: Mar. 3, 1986

[30] Foreign Application Priority Data

Mar. 6, 1985 [GB] United Kingdom ............... 8505790

[51] Int. Cl.⁴ .......................................... H03M 7/30
[52] U.S. Cl. ........................... 340/347 DD; 364/900
[58] Field of Search ............... 340/347 DD; 235/310; 358/260, 261; 364/900

[56] References Cited

U.S. PATENT DOCUMENTS 4,054,951 10/1977 Jackson ............................ 364/900

Primary Examiner—Charles D. Miller
Attorney, Agent, or Firm—Kerkam, Stowell, Kondracki & Clarke

[57] ABSTRACT

A data compression system includes an input store (1) for receiving and storing a plurality of bytes of data from an outside source. Data processing means for processing successive bytes of data from the input store includes circuit means (21-25) operable to check whether a sequence of bytes is identical with a sequence of bytes already processed, output means (27) operable to apply to a transfer medium (12) each byte of data not forming part of such an identical sequence, and an encoder (26) responsive to the identification of such a sequence to apply to the transfer means (12) an identification signal which identifies both the location in the input store of the previous occurrence of the sequence of bytes and the number of bytes in the sequence.

8 Claims, 7 Drawing Figures

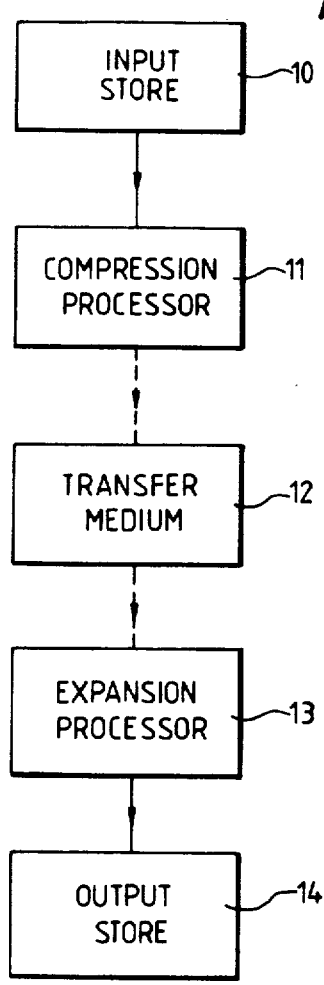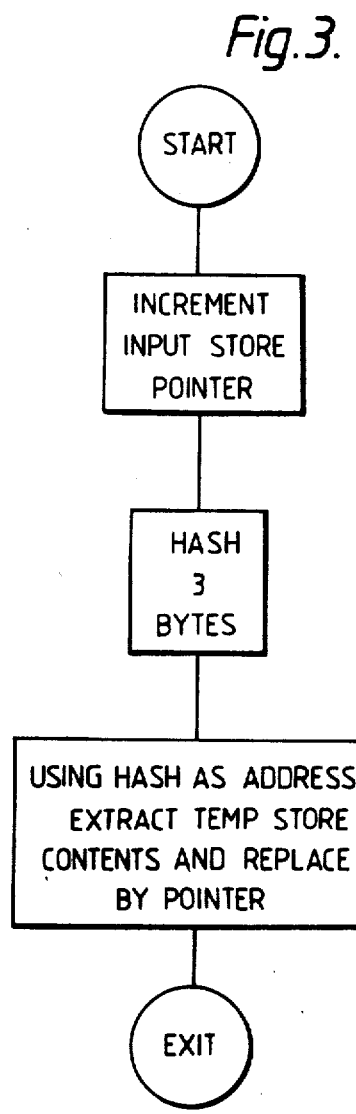

DATA COMPRESSION SYSTEM

This invention relates to a data compression system for compressing data which is to be either stored or transmitted to another location for later expansion.

Data is normally handled not a bit at a time but using a fixed length binary code referred to as a 'byte'. Commonly a byte contains eight bits, but this is not necessarily the case, and in the specification the term is to be taken as indicating a succession of bits of any convenient length.

Data compression techniques are used to reduce the amount of data to be stored or transmitted, either to reduce the storage capacity required or to reduce the transmission time. In either case it is, of course, necessary to provide the inverse expansion to enable the original data to be reconstituted.

Many data compression and expansion arrangements are known, and one common technique involves examination of the next sequence of bytes to be processed to check whether that sequence has already been handled. Some systems have a store containing a library of the most commonly used sequences. In the case of text files these sequences will be commonly-used words. Any word in the file which is contained in the library may then be replaced by the address in the library where that word may be found, and it is this address which is then stored or transmitted. In order to reconstitute the original data an identical library is necessary to enable expansion of the address to the original word to be carried out. Some systems elaborate on this technique by having a fixed library and a further variable library into which words are entered as they occur if they are not already in the fixed library. When the variable library is full the least-used words in it are deleted as new words appear.

Such a system may provide a considerable degree of text file compression, but the limiting factor is the size of the library. In addition, each word is considered separately, so that although each word may be compressed down to a library address, the potential compression represented by repeated word sequences is not realised.

It is an object of the invention to provide a data compression system which improves the compression of data.

According to the present invention there is provided a data compression system comprising an input store for receiving and storing a plurality of bytes of uncompressed data from an outside source, and data processing means for processing successive bytes of data from the input store, the data processing means including circuit means operable to check whether a sequence of successive bytes to be processed is identical with a sequence of bytes already processed, output means operable to apply to a transfer medium a representation of each byte of data not forming part of such an identical sequence, and encoding means responsive to the identification of such a sequence to apply to the transfer medium an identification signal which identifies both the location in the input store of the previous occurrence of the sequence of bytes and the number of bytes contained in the sequence.

Also according to the present invention there is provided a data compression system as set out in the preceding paragraph which includes receiving means operable to receive compressed data from the transfer medium, decoding means operable to determine whether received compressed data represents a byte of data or an identification signal, an output store operable to store any byte of data from the encoding means, and copy means operable to copy into the output store any sequence of bytes identified by the identification signal, the arrangement being such that the data contained in the output store is a reconstruction of the data applied at some earlier time to the input store.

As previously stated, the term "byte" is used to denote a collection of a required number of bits, not necessarily eight.

The term "transfer medium" is used in this specification to denote either a communication channel over which compressed data may be transmitted from a first station for reception at a second station, or a storage medium to which the compressed data may be applied for later recovery. The nature of any communication channel or of the storage medium is not relevant to the invention.

The object of the invention is achieved in two ways. Firstly the algorithm used is simplified so that a hardware realisation is made simpler or a software realisation is made faster. Secondly, the algorithm is made "date transparent", that is relatively independent of the form which the data takes. Thus the invention does not depend upon the data being in any particular form, or in any particular language, or upon the use of a particular computing device.

The invention will now be described with reference to the accompanying drawings, in which:

FIG. 1 is a schematic block diagram of the main elements of the system;

FIGS. 3 and 4 (4a,4b) are flow diagrams illustrating the operation of the circuitry of FIG. 2.

Figure 2:
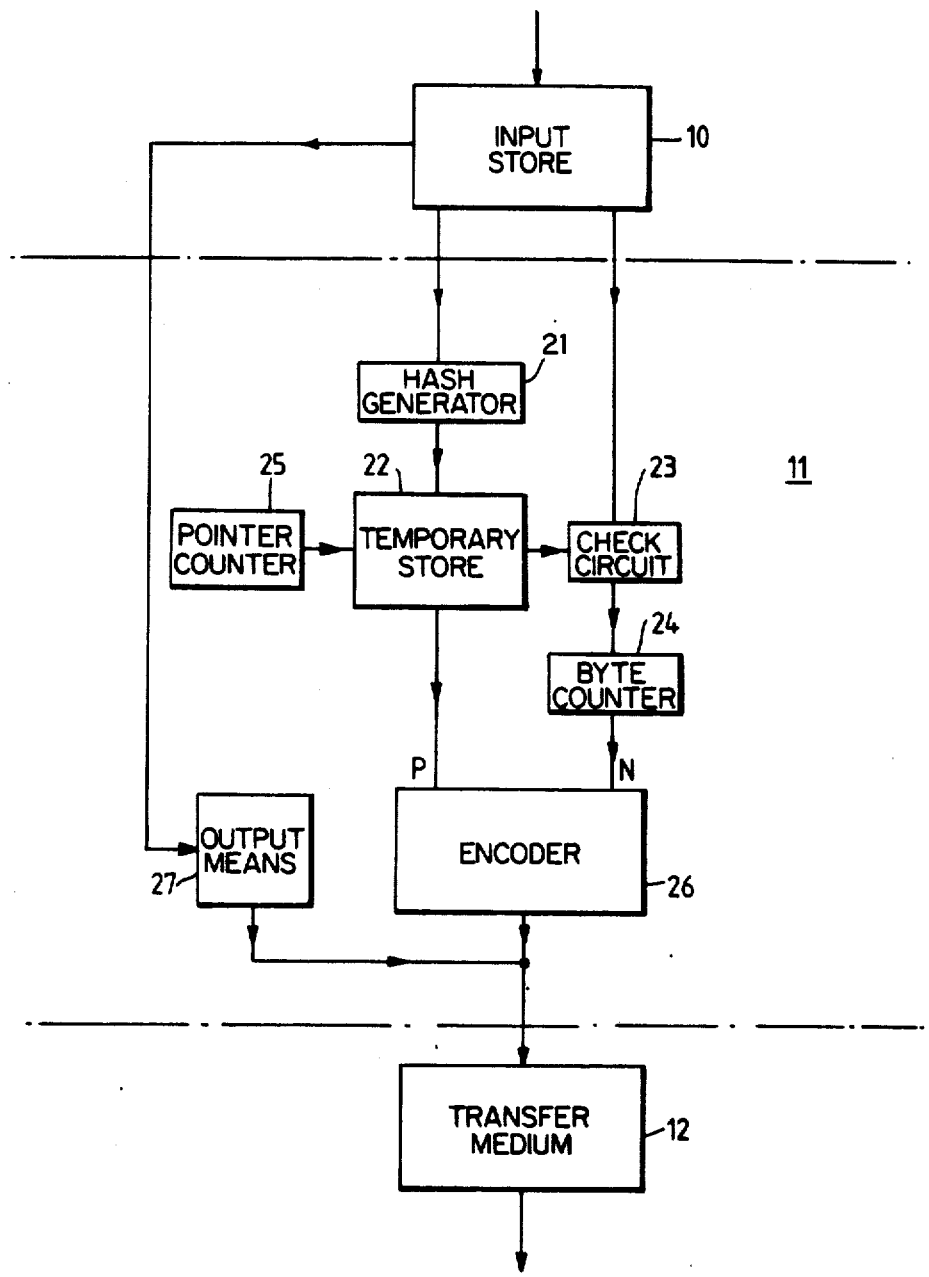
FIG. 2 is a block diagram of one embodiment of part of the system of FIG. 1.

Referring now to FIG. 1, this shows a very simple block diagram of a data compression system. An input store 10 is provided, to which may be applied data to be compressed, and the data is stored in that store until the data compression operation on that data is complete. From the input store 10 the data is passed to the compression processor 11 where it is processed and applied to a transfer medium 12. From the transfer medium 12 compressed data is applied to an expansion processor 13 where the data is processed so that the reconstituted data is applied to the output store 14 for subsequent use. Clearly if the transfer medium 12 is a communications channel the compression and expansion features will be in different location. If the transfer medium is some form of storage medium then the two features may be in the same place or in different places. The basic features shown in FIG. 1 apply to almost any data compression system, but the use of these features is different, as will be explained below.

FIG. 2 is a block diagram of part of the compression processor 11 of FIG. 1. The overall control circuitry has been omitted from this diagram for simplicity. The input store 10 is also shown in FIG. 2, as is the transfer medium 12. A hash generator 21 is connected to an output from the input store 10 and applies signals to a temporary store 22. A check circuit 23 is connected to outputs from the input store 10 and the temporary store 22. The output from the check circuit 23 is connected to a byte counter 24 which delivers an output N, whilst the temporary store delivers an output P. A pointer counter 25 is provided which is operable to apply an input to the temporary store 22. Outputs P and N pass to encoder 26 which applies appropriate signals to the transfer medium 12. Output means 27 has bytes applied to it from the input store 10. These are also passed to the transfer medium 12 after appropriate encoding. The function of the pointer counter 25 is to provide an indication of the latest byte to be read from the input store 10, and this pointer is stored in the temporary store 22 at an address determined by the hash generator in groups of three, with one byte being replaced at a time. FIG. 3 illustrates this operation.

To commence a new phase in the cycle of operation therefore a new byte is applied to the hash generator 21 and the pointer counter 25 indicates the position in the input store of this byte. Together with the two preceding bytes the new byte is encoded using a suitable "hash" or algorithm. The output of the hast generator 21 indicates an address in the temporary store 22 which corresponds to the particular combination of three bytes applied to the encoder. The check circuit 23 looks at the contents of the temporary store at the address indicated, checks whether there is a store output at that address, and stores the output of the point counter 25 at that address in the temporary store.

Figure 4A:
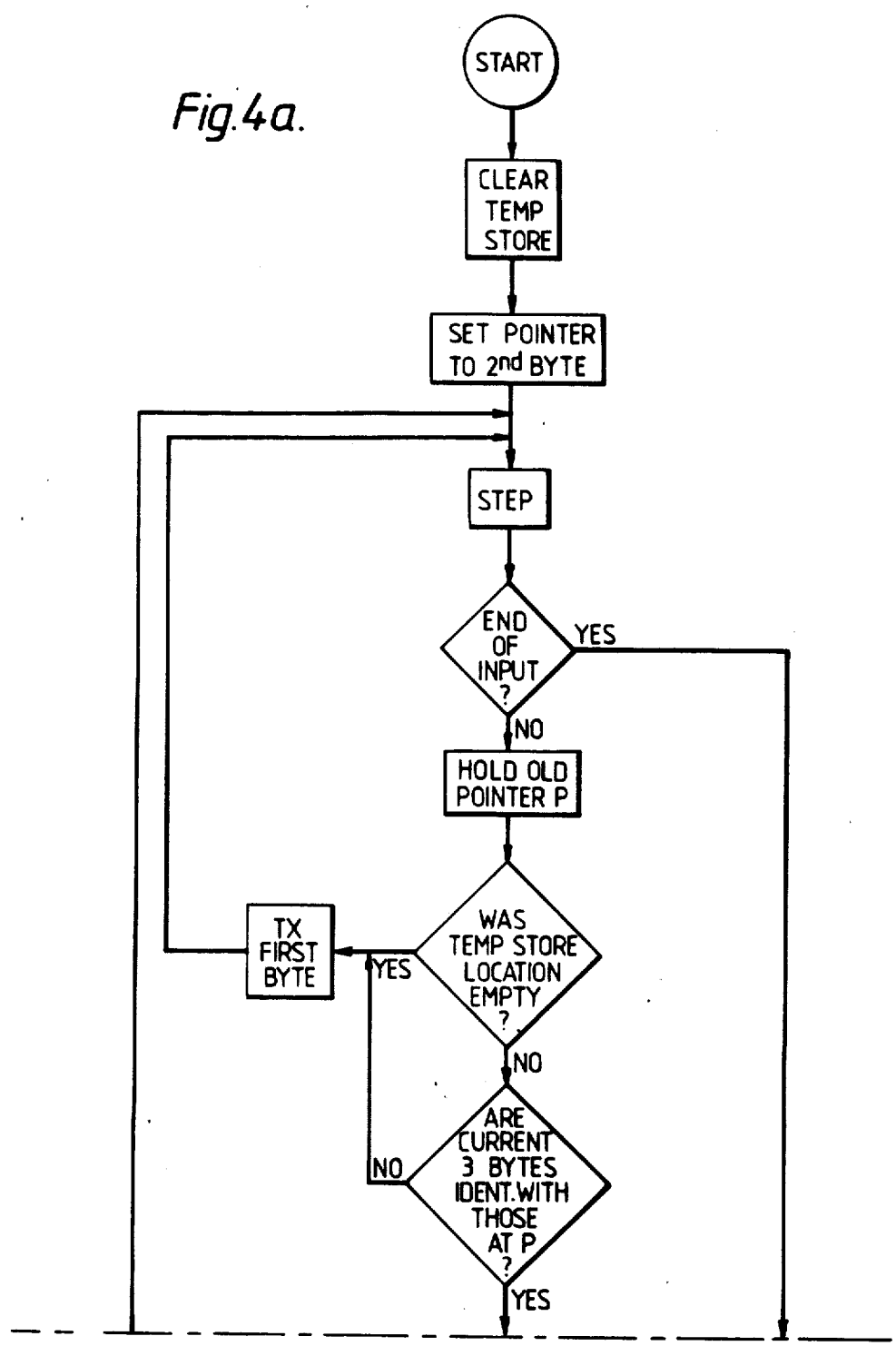
Figure 4B:
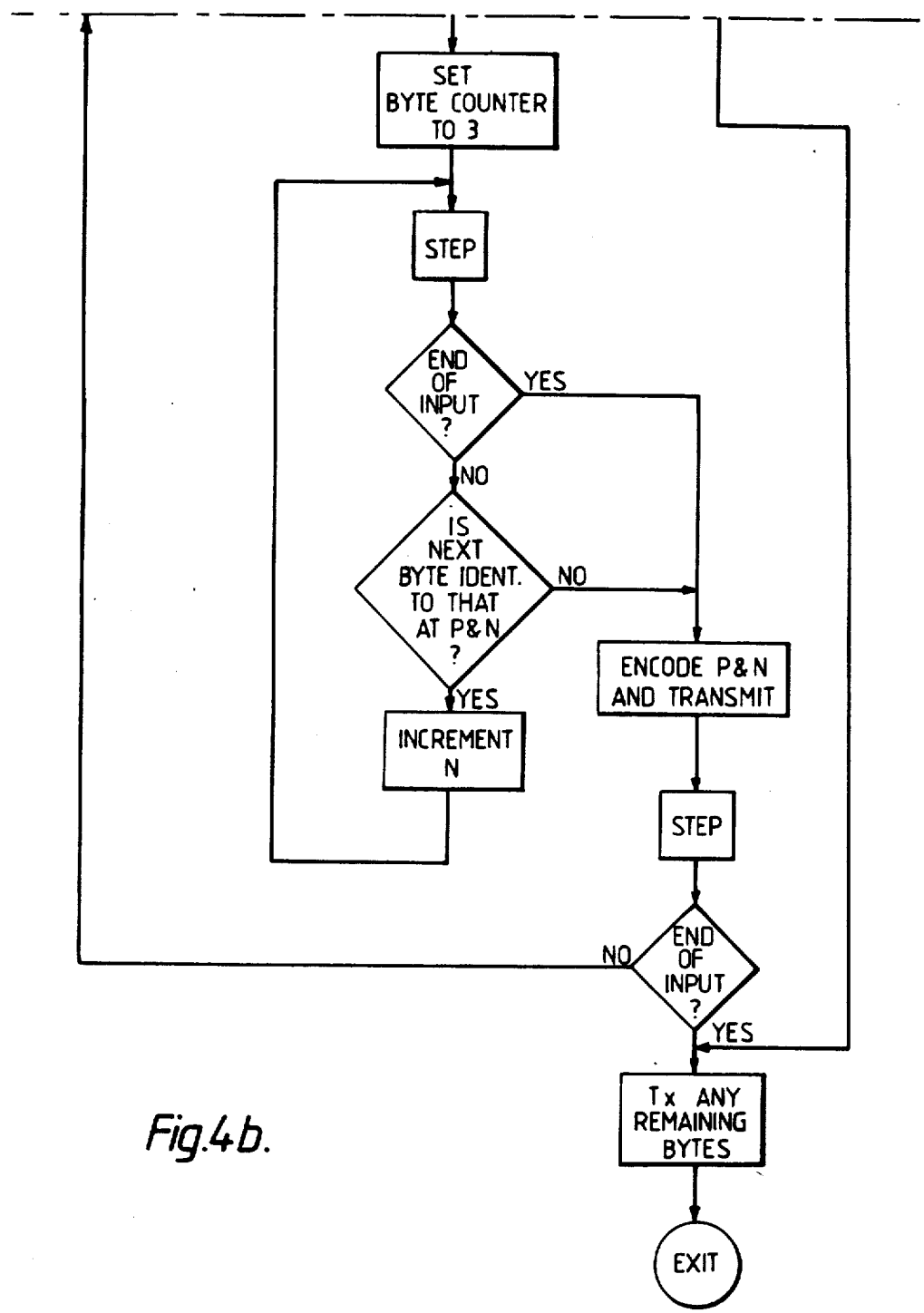

The process described above is one which occurs repeatedly during the operation of the data compressor, and it is shown in the flow diagram of FIG. 4 by the box labelled "STEP".

Referring now to FIG. 4, it is initially assumed that the input store 10 of FIG. 2 contains data on which the compression operation is to be performed. When the operation is started the first operation is to clear the temporary store 22. Since the "step" operation described earlier requires the presence of three bytes of data from the input store 10, it is necessary to set the pointer stored in pointer counter 25 of FIG. 1 to '2'.

When the next byte of data is read out from the input store 10, then the first three bytes are available to the hash generator 21. The hash operation is then performed and the contents of the temporary store 22 at the address defined by the output of the hash generator is read. If there are any more bytes of data in the input store 10, that is if the end of the data to be processed has not been reached, then any pointer found in the temporary store is held and the value of the pointer counter 25 is stored at the address. As shown in FIG. 4, if the temporary store location was in fact empty then the first byte of data in the temporary store, is transmitted. "Transmit", as used in this specification, indicates the process of passing signals to the transfer medium, whatever form that may take. The fourth byte is passed to the hash generator, which then performs the hash operation on bytes 2, 3 and 4, and the process is repeated. Each time the temporary store is addressed, the value of the pointer counter 25 relating to the latest byte to be read from the input store is stored at that address.

The cycle described above continues until a hash operation results in a temporary store address which contains a pointer. This is read out and the new pointer stored in its place. The occurrence of the stored pointer indicates that the group of three bytes which produced the address is probably identical with a previously-processed group of three bytes, the last of which is indicated by the pointer read out from the temporary store. The check circuit 23 of FIG. 2 compares the two groups of three bytes to see if they are in fact identical. This is done in case two groups of three different bytes have produced the same temporary store address after the hash operation.

As indicated in the flow diagram of FIG. 4, if in fact the two groups of bytes are not identical then the first of the bytes in the group just processed is transmitted by output means 27 and the process continues.

If the two groups of three bytes are identical then the byte counter 24 of FIG. 2 is set to 3 to indicate the number of identical bytes so far found. The check then proceeds to see if any following bytes are also identical.

The "step" operation is repeated with the next byte from the input store, since it is necessary to store a pointer for every group of three bytes in case these occur again. However, any contents found in the temporary store are now ignored. Instead, checking the next byte from the input store against the byte following the group of three previous bytes just identified. If a further identity is found then the byte counter 24 is increased by one and the check continues. This is repeated until no further identity is found, up to a preset limit, or until the need of the data is reached.

When no further identity is found then the contents of the pointer counter, indicating the first of the earlier-transmitted identical bytes, and those of the byte counter indicating the number of successive identical bytes, are suitably encoded and transmitted. The encoding is necessary so that the signal transmitted cannot be confused with the transmission of a normal byte transmitted by the output means 27.

The "step" operation is then repeated and, if there are more bytes in the input store then the whole operation restarts as indicated in the flow diagram.

When there are no more bytes in the input store then any untransmitted bytes are transmitted, and the data compression is then complete.

Figure 5:
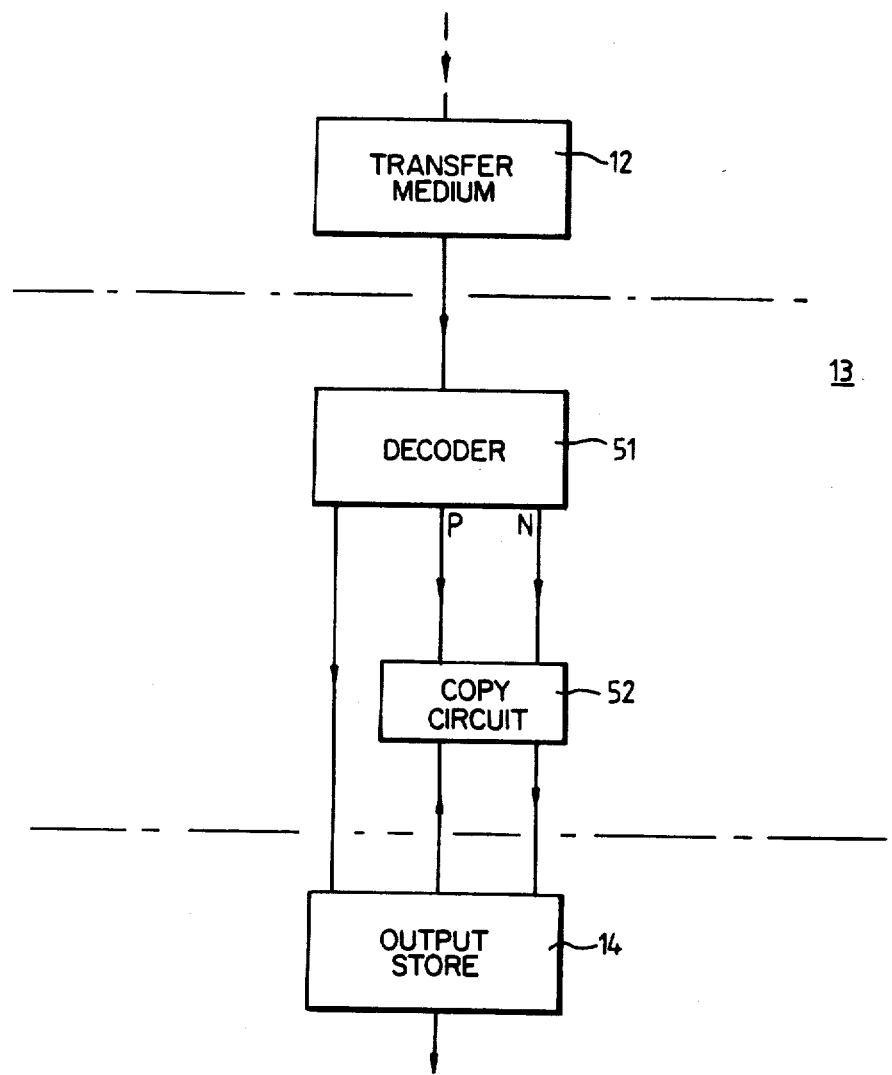
FIG. 5 is a block diagram of an embodiment of another part of the system of FIG. 1.

The expansion process is considerably simpler, and a block diagram is shown in FIG. 5, again with the transfer medium 12 and output store 14 also shown.

The expansion processor 13 of FIG. 1 includes a decoder 51 which separates the bytes transmitted by the output means 27 of FIG. 2 from the identification signals containing the outputs P and N of the pointer counter 25 and byte counter 24 respectively. In addition, the decoder 51 separates the two numbers P and N. The byte output from decoder 51 is applied directly to the output store 14, whilst the P and N outputs are applied to a copy circuit 52 which is connected to the output store 14.

Figure 6:
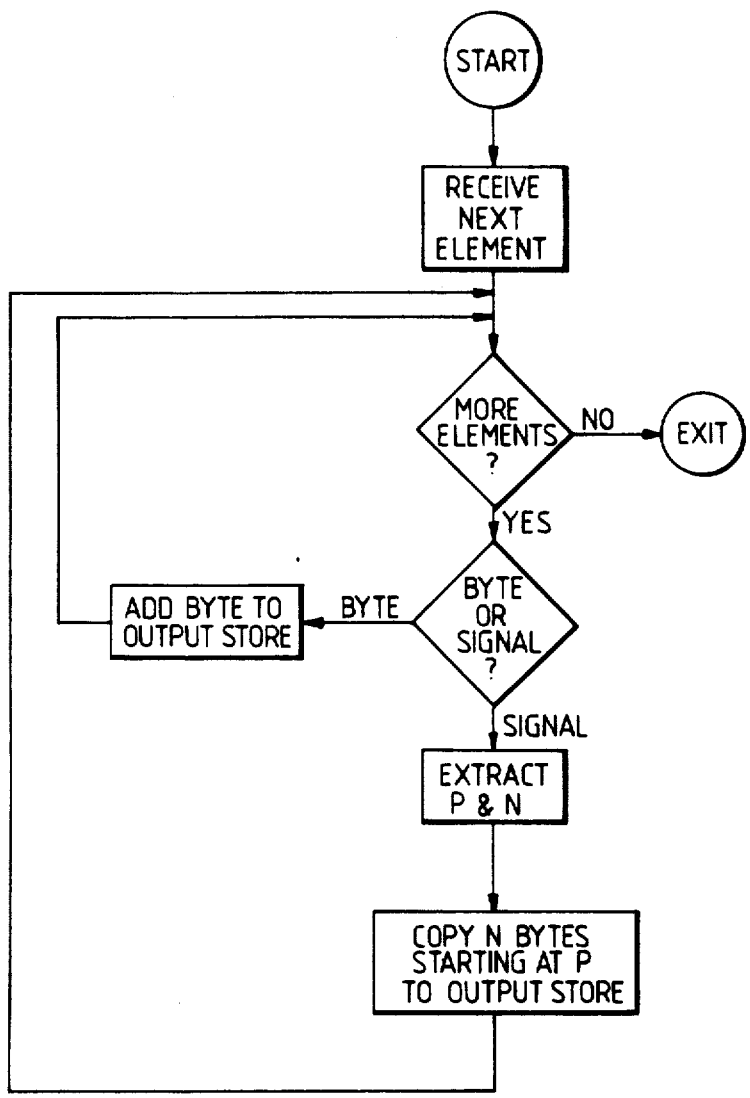
FIG. 6 is a flow diagram illustrating the operation of the circuitry of FIG. 5.

The operation of the expansion processor is shown in the flow chart of FIG. 6.

The decoder 51 receives signals from the transfer medium 12. Each of these signals is checked to see whether it is a byte or an identification signal indicating a succession of bytes which have been received earlier. If the signal is identified as a byte then that byte is entered into the output store 14. This is repeated with each successive received signal until a signal is identified as being encoded outputs of the pointer counter and byte counter of the compression processor. The signal is then decoded to give the two counter outputs P and N. The pointer P indicates the position in the output store of the first of a sequence of bytes to be repeated, and the number N indicates the number of identical bytes. These bytes are then copied in the output store and the process of expansion continues, until the data is entirely reconstituted in the output store 14.

It will be seen from the above description that not only do the input store 10 and output store 14 act as their own libraries, but also a succession of repeated bytes is indicated by a single signal. Previous systems have had to consider each small group separately. The temporary store 22 need only store pointers, that is numbers indicating the position of a byte in the input store 10, and hence need only store simple numbers. The number of pointers which may be stored in the temporary store may be limited, down to the point where the compression efficiency starts to fall unacceptably. In practice this probably occurs at between half and one quarter of the input store size. Similarly there may be practical reasons for limiting the size of the input and output stores, using these as buffers in the processing of large files. If these buffers are of a reasonable size there is little loss of efficiency, since any repetitions which are lost as a result cannot be very frequent.

The use of groups of three bytes for application to the hash generator is not essential. However, it has been found that little or no compression occurs if small groups are used, whereas use of large groups will reduce the likelihood of repeated groups. Three therefore appears to be the most convenient number.

The form of hashing algorithm used has not been discussed. Hash techniques are well known and many different forms of hash will be suitable. Similarly, nothing has been said about the form of signals sent to and from the transfer medium. It has already been stated that signals representing uncompressed bytes must be distinguished from signals indicating identity of a group of bytes with a previously-processed group. The simplest way of indicating this distinction is to set the first bit the transmitted code to '1' for one form of signal and '0' for the other. Other distinctions may be introduced and various well-known means may be used to encode the P and N outputs in the most efficient manner.

The invention has been found to be very efficient at compressing the kinds of files typically found in a computer backing store, namely a mixture of text files, program source files in several languages, program object files and data arrays.

It is, of course, possible to construct data which compresses very little or even results in slight expansion. For example, data which has already been compressed is unlikely to be further compressible.

In addition to the data compression and expansion provided by the system described above, it is a simple matter also to provide encryption of the compressed data for, say, security reasons. An encryption unit of any suitable form may be introduced before the input to the transfer medium and an equivalent description unit introduced after the output from the transfer medium. In this way the compressed data in or passing through the transfer medium may be maintained secure, and the chance of unauthorised reconstitution of the original data is probably reduced. Data which is already encrypted is unlikely to be compressible, and hence encryption should always follow compression and not precede it.

I claim:

1. A data compression system comprising an input store for receiving and storing a plurality of bytes of uncompressed data from an outside source, and data processing means for processing successive bytes of data from the input store;

the data processing means including circuit means operable to check whether a sequence of successive bytes to be processed identical with a sequence of bytes already processed, and including hash generating means responsive to the application of a predetermined number of bytes in sequence to derive a hash code appropriate to those bytes, a temporary store in which the hash code may represent the address of a storage location, and a pointer counter operable to store in the temporary store at said address a pointer indicative of the position in the input store of one of the predetermined number of bytes;

output means operable to apply to a transfer medium each byte of data not forming part of such an identical sequence; and encoding means responsive to the identification of such a sequence to apply to the transfer medium an identification signal which identifies both the location in the input store of the previous occurrence of the sequence of bytes and the number of bytes contained in the sequence.

2. A system as claimed in claim 1 in which the circuit means also includes check means operable to check for identity between each of the said predetermined number of bytes in sequence and each of a similar sequence of bytes contained in the input store at a location defined by a pointer read out from the temporary store at said address and to check whether identity exists between succeeding bytes in each sequence of bytes, and a byte counter operable to count the number of identical bytes in each sequence.

3. A system as claimed in claim 2 in which the encoder is operable when such identity exists to encode the pointer read out from the temporary store and the output of the byte counter.

4. A system as claimed in claim 1 which includes a plurality of input stores each of which contains part only of the data from the outside source.

5. A data compression system as claimed in claim 1 which includes data receiving means operable to receive compressed data from the transfer medium, an output store operable to store any uncompressed byte of data received by the receiving means, and copying means responsive to an identification signal to apply to the output store the sequence of bytes already contained in said output store and identified by the said identification signal, the arrangement being such that the data contained in the output store is an exact reconstruction of that applied at some earlier time to the input store.

6. A system as claimed in claim 5 in which the data receiving means includes decoder means operable to separate uncompressed bytes of data from identification signals.

7. A system as claimed in claim 1 in which the transfer medium comprises a communication channel between two spaced locations.

8. A system as claimed in claim 1 in which the transfer medium comprises a data storage medium.

* * * * *

UNITED STATES PATENT AND TRADEMARK OFFICE
CERTIFICATE OF CORRECTION

PATENT NO. : 4,701,745
DATED : October 20, 1987
INVENTOR(S) : Waterworth et al

It is certified that error appears in the above-identified patent and that said Letters Patent is hereby corrected as shown below:

Claim 1, line 8, "processed identical" should be -- processed is identical--

Signed and Sealed this

Thirteenth Day of December, 1988

Attest:

DONALD J. QUIGG

Attesting Officer

Commissioner of Patents and Trademarks